United States Patent
Lee et al.

(10) Patent No.: US 6,641,983 B1
(45) Date of Patent: Nov. 4, 2003

(54) METHOD FOR FORMING EXPOSED PORTION OF CIRCUIT PATTERN IN PRINTED CIRCUIT BOARD

(75) Inventors: Sung-Gue Lee, Osan (KR); Yong-Soon Jang, Osan (KR); Won-Hyeog Jin, Osan (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/659,575

(22) Filed: Sep. 11, 2000

(30) Foreign Application Priority Data

Sep. 21, 1999 (KR) ........................ 1999-40765

(51) Int. Cl.[7] .............. H05K 3/00; G03F 7/26; B23K 26/38
(52) U.S. Cl. ............. 430/317; 219/121.69; 219/121.71; 430/313
(58) Field of Search ................. 219/121.68, 121.69, 219/121.7, 121.71; 430/317, 313

(56) References Cited

U.S. PATENT DOCUMENTS

| 4,766,268 | A | * | 8/1988 | Uggowitzer |
| 4,961,259 | A | * | 10/1990 | Schreiber ............... 219/121.69 |
| 5,090,120 | A | * | 2/1992 | Matsumoto |
| 5,134,056 | A | * | 7/1992 | Schmidt et al. |
| 5,236,551 | A | * | 8/1993 | Pan |
| 5,403,978 | A | * | 4/1995 | Drabek et al. |
| 5,665,650 | A | * | 9/1997 | Lauffer et al. |
| 5,989,783 | A | * | 11/1999 | Huggins et al. ............ 430/317 |
| 6,060,330 | A | * | 5/2000 | Huggins et al. |
| 6,080,596 | A | * | 6/2000 | Vindasius et al. |
| 6,316,738 | B1 | * | 11/2001 | Mori et al. |
| 6,346,748 | B1 | * | 2/2002 | Huggins |

FOREIGN PATENT DOCUMENTS

| JP | 06045760 | | 2/1994 |
| JP | 11-312862 | * | 11/1999 |

* cited by examiner

Primary Examiner—Geoffrey S. Evans
(74) Attorney, Agent, or Firm—Birch, Stewart, Kolasch & Birch, LLP

(57) ABSTRACT

The present invention to a method for forming an exposed portion of a circuit pattern in a printed circuit board, wherein a solder resist is coated on a substrate having a circuit pattern, is hardened, and thereafter is processed by a laser in order to form a portion exposing the circuit pattern such as the solder land. When the solder resist is processed by the laser, the number of errors can be greatly reduced as compared to a processing error occurred in exposure or developing process, whereby a circuit pattern that is integrated higher than the solder land is formed for thereby miniaturizing the printed circuit board.

2 Claims, 3 Drawing Sheets

METHOD FOR FORMING EXPOSED PORTION OF CIRCUIT PATTERN IN PRINTED CIRCUIT BOARD

BACKGROUND OF THE INVENTION

1. Field of the Invention

The present invention relates to a printed circuit board, and more particularly, to a method for forming an exposed portion of a circuit pattern in a printed circuit board in which solder lands are formed in a solder resist process of a printed circuit board.

2. Description of the Background Art

FIGS. 1A through 1D sequentially illustrate a method for forming solder lands in a printed circuit board in accordance with the conventional art. Firstly, in FIG. 1A, circuit patterns 2 and solder land circuit patterns 5 are provided on a substrate 3 of a printed circuit board 1 which is preprocessed in the steps prior to the step for a solder resist process such as cleaning and surface roughness treatment.

The solder resist process is a process for coating a protective member on the circuit pattern so that solder and the like are not adhered thereon when a variety of parts mounted on a PCB are connected to the PCB by such a process as soldering. At this time, a portion to be connected with the parts forms a solder land for keeping the circuit pattern in an exposed state, not being coated with a solder resist.

Next, as illustrated in FIG. 1B, solder resist ink 7 is coated and temporally dried so that it covers the solder land circuit patterns 5 formed on the substrate 3. Here, the temporary drying process is a process in which, after coating (printing) a solder mask on a surface, the surface is dried to a certain extent it becomes non-tacky, not being completely hardened. The reason for this process is for the film not to stick fast to the surface during removal of the film, when, in the following processes, an art work film having a circuit pattern is put on the surface and is removed after exposure process, and then a developing process is carried out.

The solder resist 7 prevents the oxidation of the circuit pattern 2 and the solder land circuit pattern 5, and prevents the circuit pattern 2 and the solder land circuit pattern 5 from being damaged in the following processes.

As described above, after temporally drying the solder resist 7, an exposure film 9 for forming a solder land is positioned on the printed circuit board 1, and then is exposed to light. A light transmission portion 10 through which light is transmitted to the position at which a solder land is to be formed in the exposure film 9, and the transmission portion 10 is formed in the position corresponding to the solder land circuit pattern 5. Thus, light is transmitted only to the transmission portion 10, and thereby the solder resist 7 of the portion at which a solder land is to be formed is exposed to light. The above process is illustrated in FIG. 1C.

When the developing process is carried out after the above exposure process, the solder resist 7 of the portion exposed to light is removed, whereby a solder land S is formed, and thereafter a final hardening process is carried out. The final hardening process is a process in which the solder resist 7 is completely hardened (molecular bond) after the developing process. The above process is illustrated in FIG. 1D.

However, the conventional art has the following problem. Firstly, when the exposure process is carried out using the exposure film 9, a tolerance occurs due to various causes. Thus, considering such a tolerance, the width of the solder land circuit pattern 5 in which the solder land S is formed must be formed wide. That is, considering the decrease of size due to various errors, the solder land is formed to be larger than the required size of the solder land, whereby the size of the solder land to be exposed is maintained constant even if an error occurred.

As described above, the occurrence of error and tolerance is due to the resolution of a CAD/CAM system, position error of the printed circuit board 1, position error of the exposure film 9, deviation during exposure of the exposure film 9, deformation of the film 9, expansion and twist of the film due to heat in the exposure process, deformation of the size of the printed circuit board 1, amount of exposure, developing conditions, thickness of the solder resist, temporary drying conditions and the like.

When an error occurs in the formation of the solder land S, the width of the solder land circuit pattern 5 must be increased, considering the position error occurred during the formation of the solder land. That is, as illustrated in FIG. 2, considering various errors, the width of the solder land circuit pattern 5 has to be formed as A which is larger than a required width, B. However, the tolerance E corresponding to the portion shown in dotted line at both ends of the solder land circuit pattern 5 is formed due to various errors. If it is possible to precisely form the solder land S, the width of the solder land circuit pattern 5 can be formed as B excepting the portion shown in dotted line at both ends.

Therefore, in the conventional art, the space between both sides of the solder lands s into which circuit lines (traces) of the same size can be inserted is decreased, and the size of the entire PCB is increased as much as the size of the allowable area E. In the case that the same number of lines are required between the solder lands s, the miniaturization of the solder land pitch is restricted, which acts as an obstacle to fabrication techniques of a printed circuit board that is intelligent and has multiple pins. Actually, in the conventional art, an eccentricity of about 65~75 μm is generated during the formation of the solder land S.

SUMMARY OF THE INVENTION

Accordingly, it is an object of the present invention to simplify the process of forming a solder land portion at which a circuit pattern of a printed circuit board is exposed, and increasing the degree of precision of that portion.

It is another object of the present invention to minimize the design amount of tolerance against finishing tolerances by increasing the processing precision of a solder land portion at which a circuit pattern is exposed for thereby highly integrating or miniaturizing the printed circuit board.

To achieve the above objects, there is provided a method for forming an exposed portion of a circuit pattern in a printed circuit board which includes the steps of: forming a insulating layer on a substrate having a circuit pattern; and exposing the circuit pattern by selectively removing a predetermined portion of the insulating layer using a laser.

The present invention further includes the step of hardening the insulating layer before selectively removing the same using a laser.

In accordance with another embodiment of the present invention, there is provided a method for forming an exposed portion of a circuit pattern in a printed circuit board which includes the steps of: forming an insulating layer by coating an insulating material on a substrate having a circuit pattern; selectively removing a predetermined portion of the insulating layer by exposing and developing the same; and exposing the predetermined portion of the insulating layer using a laser.

The present invention further includes the steps of: temporally drying the coated insulating layer; and selectively removing the insulating layer by means of the above exposure and developing processes and then hardening the same.

In the present invention thusly constructed, there is an advantage that a portion such as a solder land in which the circuit pattern is exposed can be formed more precisely by a simple process, thereby highly integrating or miniaturizing the printed circuit board.

Additional advantages, objects and features of the invention will become more apparent from the description which follows.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The preferred embodiments of the present invention will now be described in detail with reference to the accompanying drawings.

Figure 1A:
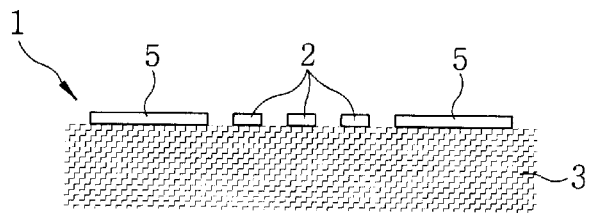
FIGS. 1A through 1D illustrate a process of forming a solder land of a printed circuit board in accordance with the conventional art.
Figure 1B:
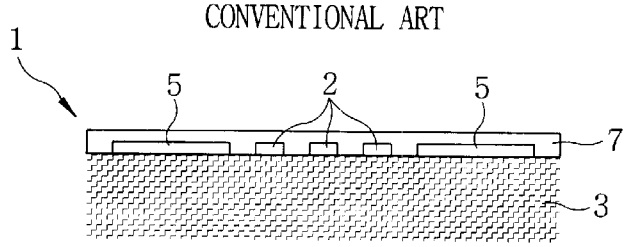
Figure 1C:
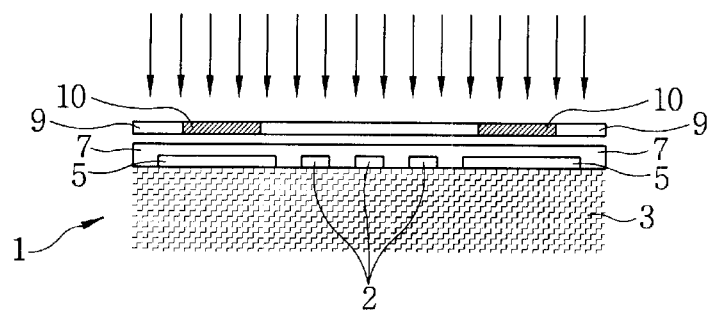
Figure 1D:
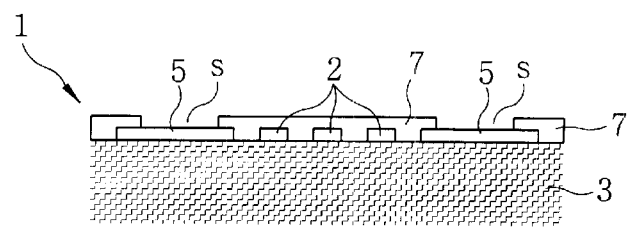
Figure 2:
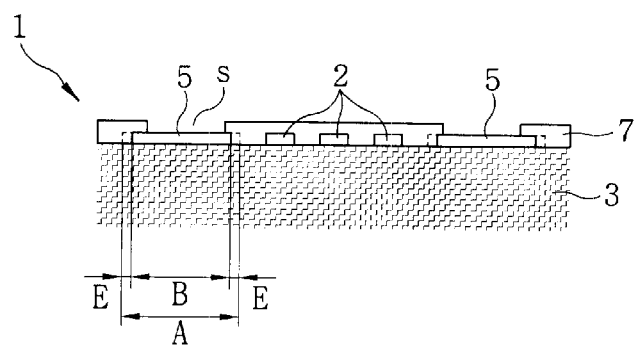
FIG. 2 is a cross-sectional view illustrating the problems of the method for forming a solder land in accordance with the conventional art.
Figure 3A:
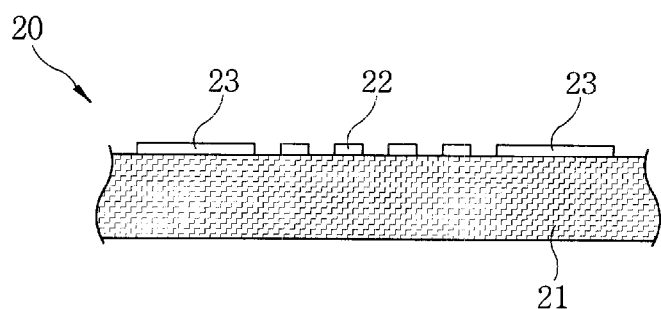
FIGS. 3A, 3B, and 3C illustrate a process of forming solder lands in accordance with a preferred embodiment of the present invention.
Figure 3B:
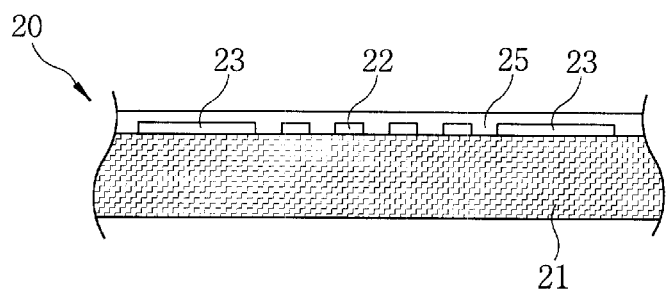

As illustrated in FIG. 3A, in one embodiment of the present invention, after finishing a pre-process for forming circuit patterns 22 and solder land circuit patterns 23 on a substrate 21 of a PCB 20, a solder resist 25 is coated on a printed circuit board 20 as illustrated in FIG. 3B.

The solder resist 25 is coated on the substrate 21, the circuit pattern 22, and the solder land circuit pattern 23, as illustrated in FIG. 3B, and then the process of hardening the solder resist 25 is performed. This hardening process is not a temporary drying process, but is identical to the conventional final hardening process.

Figure 3C:
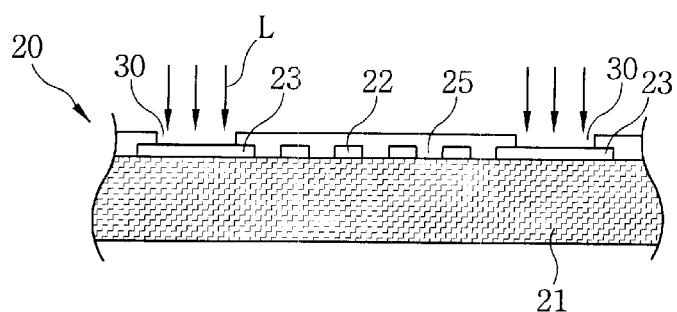

After hardening the solder resist 25 which is a sort of an insulating layer, a predetermined portion of the solder resist 25 is selectively removed using a laser L. That is, as illustrated in FIG. 3C, the laser L is irradiated on the solder resist 25, and thus a portion of the solder land circuit pattern 23 at which a solder land 30 is formed is selectively removed. Such a laser irradiating process is performed until the solder land circuit pattern 23 at which a solder land 30 is to be formed is exposed.

In this way, when the solder resist 25 is removed by the laser L, the solder land 30 is built up, and then a post-process for completing the printed circuit board 20 is performed.

Meanwhile, the laser L is configured in such a manner that a laser processor precisely removes the solder resist 25 using data from a CAD/CAM, which can be used to form a solder land 30 which is desired to be more precisely processed.

Another embodiment of the present invention will now be described. The process sequence of another embodiment of the present invention is as follows. Firstly, a solder resist 25 is coated on a substrate 21 having circuit patterns 22 and solder land circuit patterns 23. The thusly coated solder resist 25 is temporally dried.

The solder resist 25 is temporally dried in order to remove the solder resist 25 of the portion at which a solder land 30 is to be formed by exposure and developing processes. That is, an exposure film is positioned on the temporally dried solder resist 25 and then is exposed to light, and the exposed portion is developed, for thereby removing the solder resist 25. However, in this process, the solder resist 25 at the portion of the solder land 30 that is relatively easily formed, or the solder resist 25 at the portion thereof that is easily removed is removed.

Namely, the solder resist 25 at the portion relatively less demanding precision is removed. For example, only the solder resist 25 at the portion having a simple shape or at the portion not demanding precision is removed by exposure and developing processes.

Next, the process of completely hardening the solder resist 25 is performed. And, the portion at which the solder land 30 is to be formed is removed from the completely hardened solder resist 25 by using the laser L. Of course, the above-described portion at which the solder resist 25 is removed using the laser L requires a relatively high precision. In this manner, when the process of forming the solder land 30 is finished, the following processes are carried out.

In summary, in this embodiment, the portion less demanding precision is formed using the exposure film by the exposure and developing processes, and the portion demanding precision is formed by the laser L.

Hereinafter, the operation of the method for forming an exposed portion of a circuit pattern in a printed circuit board thusly constructed will be described.

The present invention is devised to form a portion exposing a circuit pattern by removing the solder resist which is an insulating layer like the solder land. At this time, the portion demanding precision is processed using the laser L. If the laser L is employed, the solder land portion can be processed more precisely, whereby the design amount of tolerance against errors can be reduced, thereby highly integrating or miniaturizing the printed circuit board.

Firstly, the high integration of the printed circuit board 20 is described with reference to FIG. 4A. The circuit pattern 22 actually formed in the drawing is shown in solid line. And, the portion shown in dotted line at the circuit pattern 22 of the portion at which the solder land 30 is formed is a portion of the solder land circuit pattern 23 formed by tolerance design against errors.

Figure 4A:
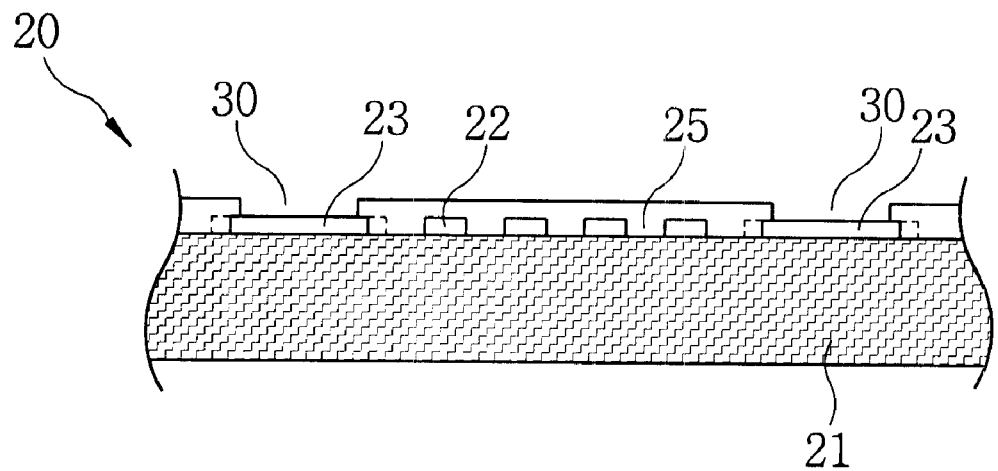
FIGS. 4A and 4B are cross-sectional views illustrating the advantages of the method of the present invention.

At this time, as illustrated in FIG. 4A, it can be known that the number of circuit patterns 22 formed between the solder lands at both sides is increased by one. That is, since the solder land 30 can be processed precisely, the width of the circuit pattern 22 of the portion at which the solder land 30 is formed can be reduced as much as the portion in dotted line. Therefore, the circuit pattern 22 can be further formed as much as the portion in dotted line for thereby achieving the high integration of the printed circuit board 20.

Actually, in case of processing the solder land 30 using the laser L, the degree of deviation at the position can be less than 35 $\mu$m. Therefore, in the case that an eccentricity of 65~75 $\mu$m is generated in the conventional art, the eccentricity at both ends of the circuit pattern 22 forming the solder land 30 can be reduced respectively by maximum 40 $\mu$m (shown in dotted line). According to this calculation, the space with an eccentricity of as many as 80 $\mu$m can be obtained between the solder lands at both sides into which a line can be inserted. Consequently, the circuit pattern can be further formed, whereby the high integration of the printed circuit board can be achieved and it is made possible to design the printed circuit board considering an increased number of I/O terminals.

Figure 4B:
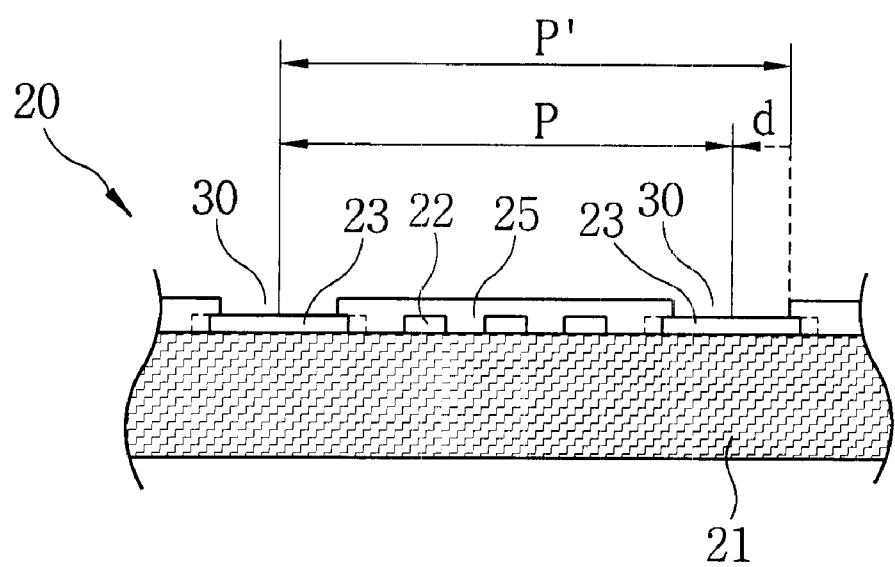

Next, the miniaturization of the printed circuit board will be described with reference to FIG. 4B.

The circuit pattern 22 actually formed are shown in solid line in the drawings. In addition, the width of the circuit pattern in case of forming the solder land 30 in the conventional art is shown in dotted line.

Here, the width of the solder land circuit pattern 23 forming the solder land 30 is decreased as much as the portion in dotted line as compared to the conventional art. Therefore, in case of forming the same number of circuit patterns 22 as in the conventional art, the pitch P between the solder lands 30 is decreased as much as d as compared to the pitch P' between the solder lands 30 in the conventional art. In this way, the decrease in pitch P between the solder lands 30 means that the size of the printed circuit board 20 is decreased as compared to the conventional art.

As described above, in the method for forming an exposed portion of a circuit pattern in a printed circuit pattern in accordance with the present invention, a solder land is formed by using a laser having a relatively high processing precision for thereby greatly reducing the design amount of tolerance of the circuit pattern as compared to the conventional art.

Subsequently, the size of the circuit pattern forming the solder land can be minimized, whereby the number of lines formed between the solder lands at both sides is increased for thereby achieving the high integration of the circuit pattern, and the pitch between the solder lands is decreased for thereby achieving the miniaturization of the printed circuit board.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for forming an exposed portion of a circuit pattern in a printed circuit board, comprising the steps of:

forming first and second circuit patterns on surface of a substrate, the first circuit patterns being disposed between the second circuit patterns;

forming an insulating layer by coating an insulating material on the first and second circuit patterns;

temporarily drying the coated insulating layer;

selectively removing first portions of the insulating layer by exposing and developing the insulating layer;

hardening the insulating layer; and selectively removing second portions of the hardened insulating layer using a laser to expose solder lands of the second circuit patterns through the removed second portions of the insulating layer without exposing the first circuit patterns, wherein the first portions are removed with less precision than the second portions.

2. A method for forming a circuit pattern of a printed circuit board comprising the steps of:

coating a solder resist on a surface of a substrate having first circuit patterns and second circuit patterns on said surface, the first circuit patterns being disposed between the second circuit patterns;

firstly drying the solder resist;

positioning an exposure film on the firstly dried solder resist;

exposing the film to light;

developing an exposed portion;

removing a first portion or portions of the exposed and developed solder resist;

completely hardening remaining solder resist by secondly drying the remaining solder resist; and removing a second portion or portions of the hardened solder resist using a laser to expose a solder land of the second circuit patterns without exposing a surface of the first circuit patterns.

* * * * *